(12) United States Patent
Krishnan et al.

(10) Patent No.: US 7,352,251 B2
(45) Date of Patent: Apr. 1, 2008

(54) SYSTEMS AND METHODS FOR SUPPRESSING FEEDBACK AND REFERENCE NOISE IN A PHASE LOCK LOOP CIRCUIT

(75) Inventors: Koushik Krishnan, Stanford, CA (US); Prasun Kali Battacharya, Dist.-Burdwan (IN)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 11/368,287

(22) Filed: Mar. 2, 2006

(65) Prior Publication Data

US 2007/0216489 A1    Sep. 20, 2007

(51) Int. Cl.
*H03L 7/00* (2006.01)
(52) U.S. Cl. .............. 331/16; 331/17; 331/177 R; 331/34; 331/1 A
(58) Field of Classification Search .............. 331/16, 331/17, 34, 1, 177 R
See application file for complete search history.

(56) References Cited

U.S. PATENT DOCUMENTS

| 5,659,269 | A  | * | 8/1997 | Myers   | 331/17  |
| 6,570,457 | B2 | * | 5/2003 | Fischer | 331/17  |
| 7,038,509 | B1 | * | 5/2006 | Zhang   | 327/157 |

* cited by examiner

*Primary Examiner*—Arnold Kinkead
(74) *Attorney, Agent, or Firm*—Steven A. Shaw; W. James Brady; Frederick J. Telecky, Jr.

(57) ABSTRACT

Various systems and methods for clock management. As one example, a system for clock management is disclosed that includes a controllable oscillator, an oscillation control source, and a sample and hold circuit. The sample and hold circuit is disposed between the oscillation control source and the controllable oscillator, and is operable to introduce a transfer function having a sin x/x characteristic with a null at a switch frequency applied to the sample and hold circuit.

16 Claims, 4 Drawing Sheets

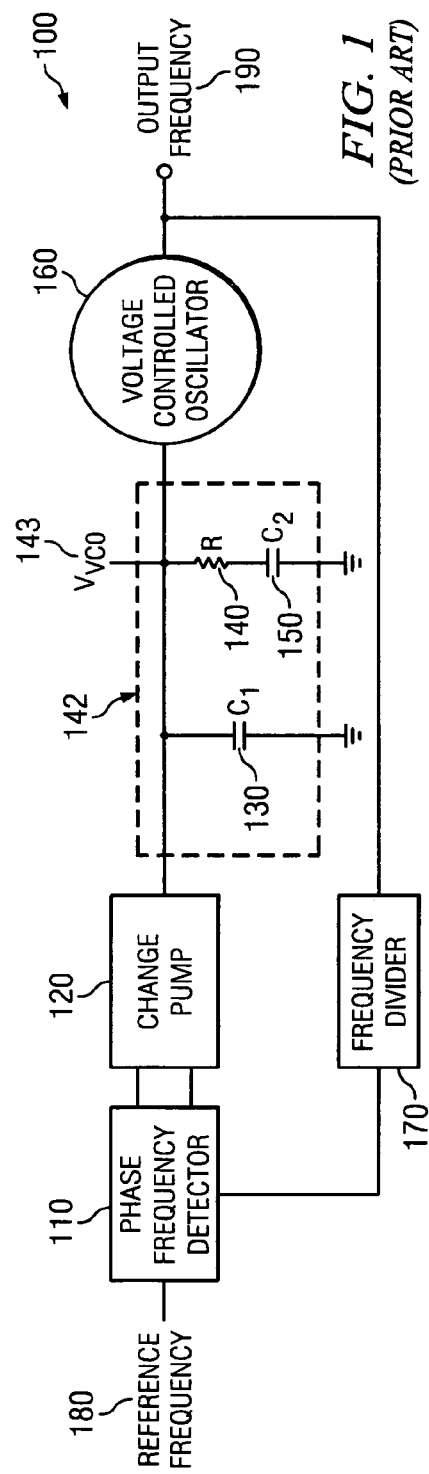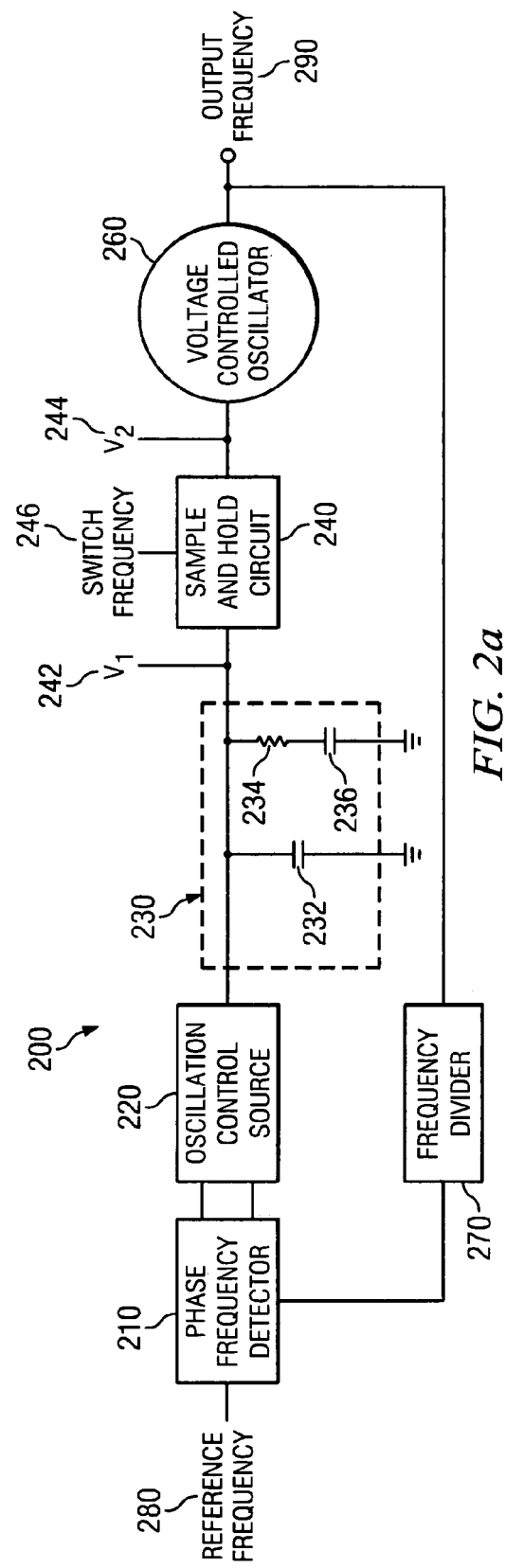

SYSTEMS AND METHODS FOR SUPPRESSING FEEDBACK AND REFERENCE NOISE IN A PHASE LOCK LOOP CIRCUIT

BACKGROUND OF THE INVENTION

The present invention is related to systems and methods for clock management, and in particular to systems and methods for maintaining a desired clock frequency.

Phase lock loop circuits are used in many applications as frequency synthesizers to generate a precise frequency signal with both good phase noise and low spurs. An exemplary basic phase lock loop circuit is shown in FIG. 1, and may be used to manage clock frequency and phase. Turning to FIG. 1, a basic phase lock loop circuit 100 is shown that includes a phase/frequency detector 110, a charge pump 120, a loop filter 142 consisting of two capacitors 130, 150 and a resistor 140, a voltage controlled oscillator 160, and a frequency divider 170. In operation, a reference frequency 180 is compared with a divided feedback of an output frequency 190, and the comparison is used to drive voltage controlled oscillator 160 to form output frequency 190 consistent with reference frequency 180. Where frequency divider 170 causes a division by 'N', phase lock loop circuit 100 forces output frequency 190 to be exactly N times reference frequency 180. Phase/frequency detector 110 and charge pump 120 deliver either positive or negative charge pulses to voltage controlled oscillator 160 depending upon whether the phase of output frequency 180 leads or lags reference frequency 190. The delivered charge pulses are integrated by loop filter 142 to generate a tuning voltage ($V_{VCO}$) that is applied to voltage controlled oscillator 160 causing the frequency to increase or decrease. As will be appreciated from the preceding description, output frequency 190 may be adjusted by changing either or both of reference frequency 180 or the value of frequency divider 170.

Even when phase lock loop circuit 100 is locked, charge pump 120 generates "spurs". Loop filter 142 provides some reduction in such spurs before the spurs are visible to voltage controlled oscillator 160. Loop filter 142 includes a resistor 140 that provides a stability zero, and capacitor 130 suppresses glitches generated by charge pump 120 that occur in association with reference frequency comparison. In contrast, capacitor 150 operates to lower any ripple on the control voltage $V_{VCO}$ 143 applied to voltage controlled oscillator 160. However, capacitor 130 must typically be less than ten percent of the value of capacitor 150 to avoid under-damped settling. Thus, to assure sufficient reduction in ripple, phase lock loop circuit 100 requires a large value for capacitor 150 and an even larger value for capacitor 130. This, of course incurs all of the problems associated with using large capacitors including slow operation, and increased space requirements.

Hence, for at least the aforementioned reasons, there exists a need in the art for advanced systems and methods for clock management.

BRIEF SUMMARY OF THE INVENTION

The present invention is related to systems and methods for clock management, and in particular to systems and methods for maintaining a desired clock frequency.

Some embodiments of the present invention provide for systems for clock management. The systems include a controllable oscillator, an oscillation control source, and a sample and hold circuit disposed between the oscillation control source and the controllable oscillator. In some cases, the sample and hold circuit includes two capacitors and two switches. One of the capacitors is electrically coupled to one of the switches and the controllable oscillator, while the other capacitor is electrically coupled to both of the switches. In one particular case, one of the switches is electrically coupled to both of the capacitors, and the other of the switches is electrically coupled to one of the switches and to the oscillation control source.

In some instances of the embodiments, the system further includes a divider circuit that is driven by the controllable oscillator. In addition, a phase/frequency detector is included that drives the oscillation control source, and is driven by a reference frequency and an output of the divider circuit. In addition, some instances of the embodiments include a filter disposed between the oscillation control source and the controllable oscillator. The filter may provide a stabilizing zero and a capacitor that is operable to reduce any ripple on the control input to the controllable oscillator.

In particular instances of the embodiments, a switch frequency is applied to both of the aforementioned switches. In such a situation, one of the switches is open when the other is closed, with the two switches switching at the switch frequency. In one particular case, opening and closing the switches as described causes the sample and hold circuit to introduce a transfer function having a sin x/x characteristic with a null at the switch frequency. In one particular instance of the embodiments, the system forms part of a sigma-delta phase lock loop circuit.

Other embodiments of the present invention provide methods for clock management. Such methods include providing a phase lock loop circuit that includes a controllable oscillator, an oscillation control source, and a sample and hold circuit disposed between the controllable oscillator and the oscillation control source. The methods further include applying a switch frequency to the sample and hold circuit. The sample and hold circuit receives a signal from the oscillation control source either directly or indirectly, and applies the held signal to the controllable oscillator. In some instances of the embodiments, the sample and hold circuit introduces a transfer function in the phase lock loop circuit with a sin x/x characteristic with a null at the switch frequency.

In some cases, the sample and hold circuit includes a switch electrically coupled to the oscillation control source and to a capacitor. The capacitor is electrically connected to another switch which is connected to the controllable oscillator. The other switch is also connected to another capacitor. In some instances, applying the switch frequency to the sample and hold circuit includes applying a derivative of the switch frequency to one of the switches, and applying another derivative of the switch frequency to the other switch. In particular instances of the embodiments, one of the derivatives of the switch frequency is asserted such that one switch is closed at a time when the other derivative of the switch frequency is asserted such that the other switch is open.

Yet other embodiments of the present invention provide a phase lock loop circuit that includes a phase/frequency detector, an oscillation control source, and a sample and hold circuit. The oscillation control source is electrically coupled to the phase/frequency detector, and the sample and hold circuit is electrically coupled to the oscillation control source. The phase lock loop circuit further includes a controllable oscillator that is electrically coupled to the sample and hold circuit, and a divider circuit that is electrically coupled to the phase/frequency detector and to the controllable oscillator.

In one particular instance of the embodiments, the sample and hold circuit includes a capacitor that is electrically coupled to two switches. One of the switches is electrically coupled to the oscillation control source, and the other switch is electrically coupled to another capacitor and to the controllable oscillator. A switch frequency is applied to the switches such that one of the switches is open when the second switch is closed. The sample and hold circuit is operable to introduce a transfer function having a sin x/x characteristic with a null at the switch frequency.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 depicts an existing phase lock loop circuit;

FIG. 2a shows a phase lock loop circuit with a sample and hold circuit in accordance with one or more embodiments of the present invention;

FIG. 2b is a timing diagram showing the operation of the phase lock loop of FIG. 2a;

FIG. 3b is a timing diagram depicting operation of the phase lock loop circuit of FIG. 3a.

DETAILED DESCRIPTION OF THE INVENTION

Figure 2B:
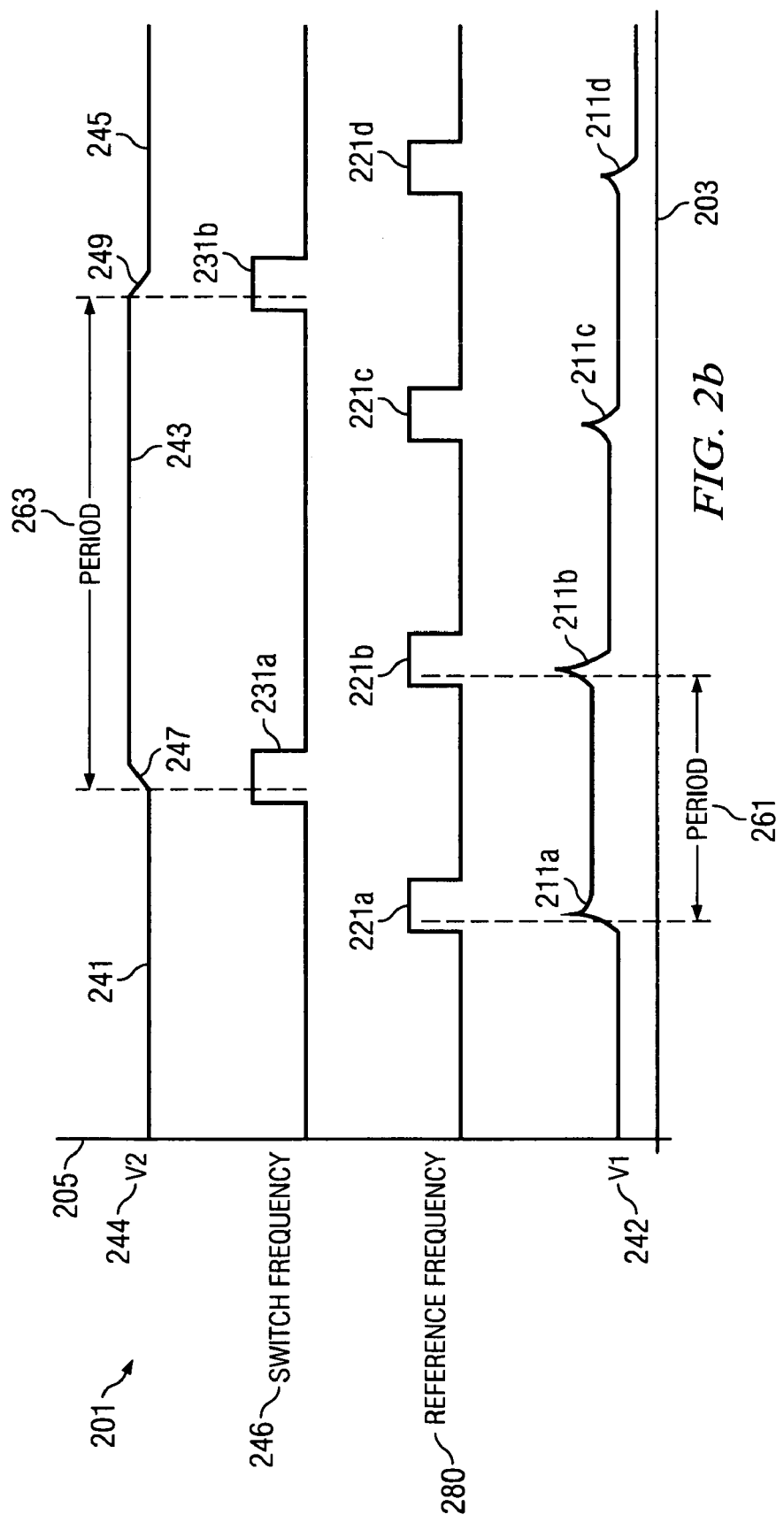

The present invention is related to systems and methods for clock management, and in particular to systems and methods for maintaining a constant clock frequency.

Some embodiments of the present invention provide for systems for clock management. As used herein, the term "clock" is used in its broadest sense to mean any signal whether it be electrical, optical or otherwise that exhibits a particular frequency or range of frequencies. Thus, as just one of many examples, a clock may be a synchronizing signal used on a semiconductor device to control operation of one or more electrical circuits. Such a clock may be specified as, for example, a ten megahertz signal plus of minus ten percent. Based on the disclosure provided herein, one of ordinary skill in the art will recognize a myriad of clocks that may be used in accordance with embodiments of the present invention. Further, as used herein, the phrase "clock management" is used in its broadest sense to mean any activity whereby any aspect of a clock is monitored and/or manipulated. Thus, for example, clock management may include monitoring and/or manipulating the phase and/or frequency of a clock. In some cases, this may be done via a phase lock loop circuit.

Such embodiments include a controllable oscillator, an oscillation control source, and a sample and hold circuit disposed between the oscillation control source and the controllable oscillator. As used herein, the phrase "controllable oscillator" is used in its broadest sense to mean any circuit, device and/or system capable of providing an oscillating output where some aspect of the oscillating output is controllable via an input. Thus, a controllable oscillator may be, but is not limited to, a voltage controlled oscillator. Such voltage controlled oscillators are generally known in the art, and provide a clock output at a frequency that is governed by a voltage input. Based on the disclosure provided herein, one of ordinary skill in the art will recognize a variety of controllable oscillators that may be used in accordance with one or more embodiments of the present invention. The various embodiments described herein are described using a voltage controlled oscillator, however, it should be noted that in one or more cases it may be possible to utilize another type of controllable oscillator. Also, as used herein, the phrase "oscillation control source" is used in its broadest sense to mean any circuit, device, and/or system capable of providing a signal for controlling a controllable oscillator. Thus, an oscillation control source may be, but is not limited to, a charge pump as is known in the art. Such charge pumps are generally capable of sinking and sourcing electrical current in a proportion related to a desired output frequency. Based on the disclosure provided herein, one of ordinary skill in the art will recognize a variety of oscillation control sources that may be used in relation to various embodiments of the present invention.

In addition, as used herein, the phrase "sample and hold" circuit is used in its broadest sense to mean any device, circuit and/or system capable of monitoring an input signal, and of outputting a select representation of the input signal. Based on the disclosure provided herein, one of ordinary skill in the art will recognize a variety of sample and hold circuits that may be used in relation to the various embodiments of the present invention. In some particular embodiments of the present invention, a sample and hold circuit composed of two switches and two capacitors is utilized. In such a case, one of the capacitors is electrically coupled to one of the switches and the controllable oscillator, while the other capacitor is electrically coupled to both of the switches. Further, one of the switches is electrically coupled to both of the capacitors, and the other of the switches is electrically coupled to one of the switches and to the oscillation control source. Again, based on the disclosure provided herein, one of ordinary skill in the art will recognize other implementations of a sample and hold circuit that may be used in relation to one or more embodiments of the present invention.

In some instances of the embodiments, the system further includes a divider circuit that is driven by the controllable oscillator. As used herein, the phrase "divider circuit" or the term "divider" are used in their broadest sense to mean any circuit, device and/or system capable of receiving some input, and providing an output that exhibits a divided relationship to the input. Thus, a divider may be, but is not limited to, a frequency divider that is capable of receiving an input signal at a particular frequency, and of providing an output signal at a frequency which is a divided value of the frequency of the input signal. Based on the disclosure provided herein, one of ordinary skill in the art will recognize a variety of dividers or divider circuits that may be used in relation to one or more embodiments of the present invention.

In addition, a phase/frequency detector is included that drives the oscillation control source, and is driven by a reference frequency and an output of the divider circuit. As used herein, the phrase "phase/frequency detector" is used in its broadest sense to mean any device capable of detecting a difference in one or both of the phase and frequency of two input signals. Also, some instances of the embodiments include a filter disposed between the oscillation control source and the controllable oscillator. Such a filter may provide some level of signal or output conditioning to one or more signals or outputs provided as inputs either directly or indirectly to the controllable oscillator. As one of many examples, the filter may be a low pass filter. Alternatively, or in addition, the filter may provide a stabilizing zero and a capacitor that is operable to reduce any ripple on the control input to the controllable oscillator. Based on the disclosure provided herein, one of ordinary skill in the art will recognize a variety of filters that may be used in relation to the various embodiments of the present invention.

In particular instances of the embodiments, a switch frequency is applied to both of the aforementioned switches. In such a situation, the two switches are both switched at the same switch frequency, with one of the switches is open for at least a portion of the time that the other is closed. In one particular case, this may be achieved by using a common switch frequency signal applied to both switches where one of the switches is activated or caused to close whenever the switch frequency signal is asserted high, and the other switch is activated or caused to close whenever the switch frequency is asserted low. Alternatively, the aforementioned switching scheme may be accomplished by applying a switch frequency to one of the switches, and a time delayed derivative of the switch frequency signal to the other switch. As used herein, the phrase "derivative of the switch frequency" is used in its broadest sense to mean any signal that is derived from a switch frequency signal or the switch frequency signal itself. Thus, as just some of many examples, a derivative of the switch frequency may be a time shifted representation of the switch frequency, an inverted representation of the switch frequency, a divided representation of the switch frequency, or the like. Based on the disclosure provided herein, one of ordinary skill in the art will recognize a variety of approaches that may be used to activate the two switches such that they switch in a desired relationship one to the other, and/or derivatives of the switch frequency that may be used in relation to one or more embodiments of the present invention. In one particular case, opening and closing the switches as described causes the sample and hold circuit to introduce a transfer function having a sin x/x characteristic with a null at the switch frequency. In one particular instance of the embodiments, the system forms part of a sigma-delta phase lock loop circuit.

Other embodiments of the present invention provide methods for clock management. Such methods include providing a phase lock loop circuit that includes a controllable oscillator, an oscillation control source, and a sample and hold circuit disposed between the controllable oscillator and the oscillation control source. The methods further include applying a switch frequency to the sample and hold circuit. The sample and hold circuit receives a signal from the oscillation control source either directly or indirectly, and applies the held signal to the controllable oscillator. In some instances of the embodiments, the sample and hold circuit introduces a transfer function in the phase lock loop circuit with a sin x/x characteristic with a null at the switch frequency.

In some cases, the sample and hold circuit includes a switch electrically coupled to the oscillation control source and to a capacitor. As used herein, the phrase "electrically coupled" is used in its broadest sense to mean any coupling whereby a signal from one element or a derivative thereof may be received as an electrical signal by another element. Thus as just one example, two elements may be electrically coupled where an electrically conductive wire connects the elements. As another example, two elements may be electrically coupled where one element provides an optical signal to an optical coupler that transforms the signal from the optical domain to the electrical domain and provides the electrical output to the other element. As yet another example, two elements may be considered electrically coupled where a signal from one element is provided to a filter which conditions the signal and passes the conditioned signal to the other element. There are, of course, many other examples of electrical coupling that comport with the aforementioned definition, and that may be used in relation to embodiments of the present invention.

Design of phase lock loop circuits often involves a tradeoff between the design of the voltage controlled oscillator and suppression of input noise. For example, for fine frequency resolution of the phase lock loop circuit, it is desirable to use a low reference frequency. However, such an approach may cause spurs to be generated near the output frequency from the phase lock loop circuit. A solution to this problem is to include a filter with a very tight bandwidth selected to eliminate such spurs. As will be appreciated by one of ordinary skill in the art, this will result in a phase lock loop circuit that exhibits a tight loop bandwidth with a corresponding increased transient settling time from one frequency to another. Such a phase lock loop circuit may not operate fast enough to lock. In addition, such a tight loop bandwidth may result in a reduction in the suppression of the voltage controlled oscillators' phase noise occurring outside the loop bandwidth.

Where a sigma-delta phase lock loop circuit is utilized, noise suppression is often achieved by severely constraining the bandwidth of the phase lock loop circuit. This approach substantially constrains any voltage controlled oscillator design since the noise from the voltage controlled oscillator sees a high pass transfer function. Similarly, the bandwidth of an Integer-N phase lock loop circuit is often severely constrained in order to suppress noise at the input of the voltage controlled oscillator. Such a design constraint typically requires that the phase noise of the voltage controlled oscillator be less than the noise of other elements in the phase lock loop circuit at the cut-off frequency. As set forth above, these requirements substantially increase the design complexity of the phase lock loop circuit. Further, because the LC oscillators active in the phase lock loop circuit must be designed to meet the aforementioned frequency requirements, the area required to implement a particular design is often increased.

Turning to FIG. 2a, a phase lock loop system 200 in accordance with one or more embodiments of the present invention is shown. Phase lock loop circuit 200 includes a phase/frequency detector 210, an oscillation control source 220, a loop filter 230 consisting of two capacitors 232, 236 and a resistor 234, a sample and hold circuit 240, a voltage controlled oscillator 260, and a frequency divider 270. In general operation, a reference frequency 280 is compared with a feedback of an output frequency 290, and the comparison is used to drive voltage controlled oscillator 260 to form output frequency 290 consistent with reference frequency 280. Loop filter 230 is a low pass filter including a resistor 234 and two capacitors 232, 336.

In some embodiments of the present invention, sample and hold circuit 240 introduces a zero at a desired switch frequency 246 without the necessity of increasing the value of the passive elements. To do so, sample and hold circuit 240 receives a filtered voltage ($V_1$) 242 provided by oscillation control source 220 via filter 230. Sample and hold circuit 240 samples $V_1$ 242 at switch frequency 246, and provides the sampled voltage ($V_2$) 244 to voltage controlled oscillator 260. In some instances, this sampling process is done using one or more sampling switches that may or may not be incorporated into loop filter 230. Sample and hold circuit 240 samples $V_1$ 242 periodically and retains the sampled value for a period roughly equivalent to the period of switch frequency 246. This introduces a sample and hold (or, track and hold as the case may be) transfer function into the loop characteristics of phase lock loop circuit 200. As a sample and hold transfer function has a sinc (sing x/x) characteristic with the null at switch frequency 246 and its harmonics, sample and hold circuit 240 operates to aid noise suppression. By using sample and hold circuit 240, voltage controlled oscillator 260 is not exposed to periodic transient effects which can cause spurs. Further, use of sample and hold circuit 240 increases the immunity of voltage controlled oscillator 260 to noise occurring around switch frequency 246 (e.g., the maximum noise due to sigma-delta at reference frequency 280 in half).

Further, in contrast to a standard loop filter, the range of values for capacitors 232, 236 is increased due to the addition of sample and hold circuit 240. Thus, the design restraints discussed above in relation to other phase lock loop circuit architectures may be largely avoided.

Turning to FIG. 2b, operation of phase lock loop circuit 200 is shown by a timing diagram 201. Timing diagram 201 shows a number of variables listed on a vertical axis 205 all interrelated as a function of time displayed on a horizontal axis 203. The variables include $V_1$ 242, reference frequency 280, switch frequency 246, and $V_2$ 244. Reference frequency 280 is shown as a number of clock pulses 221 with a period 261. Period 261 is also associated with a number of glitches 211 that occur on $V_1$ 242. It is desirable to avoid presenting glitches 211 to voltage controlled oscillator 260. To do this, $V_1$ 242 is sampled periodically under the control of switch frequency 246. Switch frequency 246 is shown as a series of clock pulses 231, and may be any frequency value. However, in some cases, it is desirable to select reference frequency 280 as some multiple of switch frequency 246. Where switch frequency 246 is delayed from reference frequency 280, a sample of $V_1$ 242 may be attained away from glitches 211. As shown, switch frequency 246 is one half of reference frequency 280 with period 263 being depicted as twice as long as period 261. Based on the disclosure provided herein, one of ordinary skill in the art will recognize a variety of combinations of reference frequency 280 and switch frequency 246. For example, switch frequency 246 may be selected to be one quarter of reference frequency 280. The sampled value is then maintained as $V_2$ 244 which is applied to voltage controlled oscillator 260. $V_2$ 244 includes an original sample 241 followed by a transition 247 to another sample 243 triggered by clock pulse 231a. Another transition 249 and associate sample 245 are triggered by clock pulse 231b. Based on the disclosure provided herein, one of ordinary skill in the art will recognize a variety of circuits that may be designed to perform the function of sample and hold circuit 240.

A model of a sigma-delta phase lock loop circuit was created using Matlab™. Using the model, a conventional sigma-delta phase lock loop circuit was compared with a sigma-delta phase lock loop circuit incorporating a sample and hold circuit in accordance with one or more embodiments of the present invention. The included sample and hold circuit was clocked at 6 MHz, while the reference frequency was 24 MHz, and the output frequency was 420 MHz. The results showed a dramatic improvement in jitter from 10 ps for the conventional phase lock loop circuit to 6 ps for the phase locked loop circuit including the sample and hold circuit. A small reduction in phase margin also resulted due to the sampling by the sample and hold circuit. Table 1 below shows the results of the model.

TABLE 1

Exemplary Results of Comparison Between Conventional PLL and a PLL with a Sample and Hold Circuit

| Architecture | Conventional PLL | PLL with Sample and Hold |
|---|---|---|
| Switch Frequency | N/A | 6 MHz |
| $K_{VCO}$ | 240 MHz/V | 240 MHz/V |
| $K_{PD}$ | 80 uA | 80 uA |
| Reference Frequency | 24 MHz | 24 MHz |
| Output Frequency | 420 MHz | 420 MHz |
| Bandwidth | 300 kHz | 300 kHz |
| Phase Margin | 63 degrees | 55 degrees |
| Jitter | 10 ps | 6 ps |

Figure 3A:
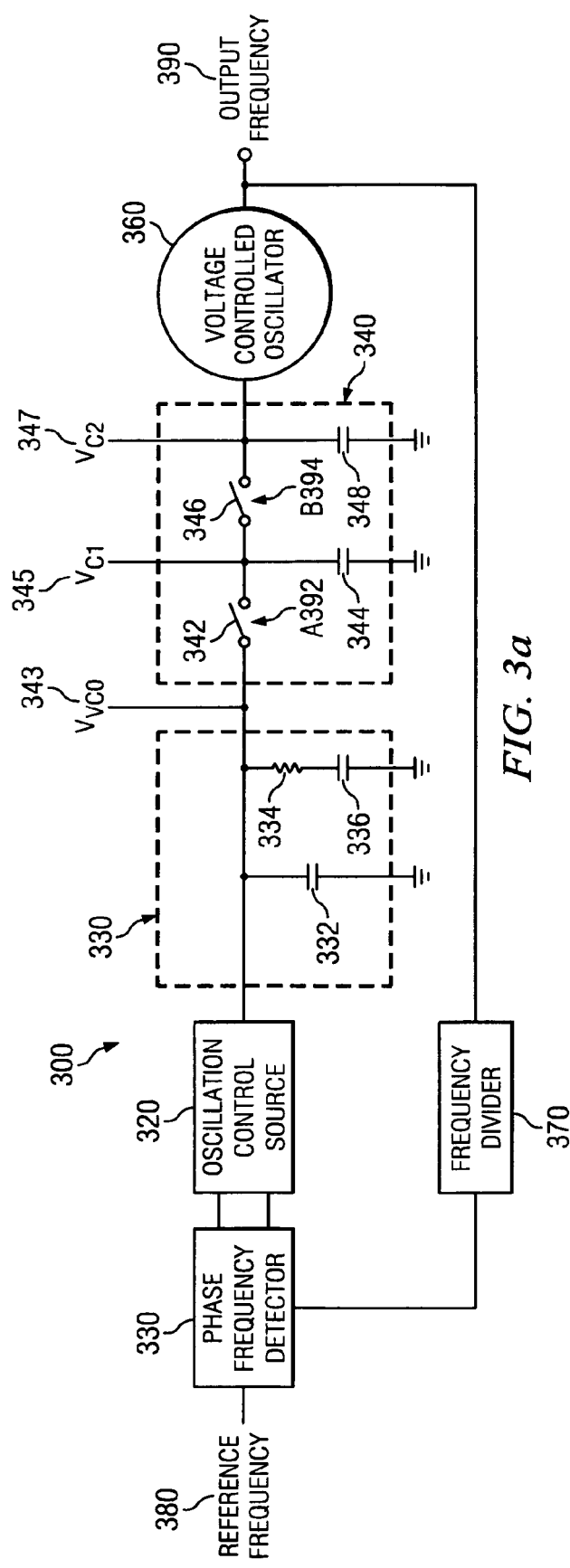
FIG. 3a shows another phase lock loop circuit with a particular sample and hold circuit in accordance with other embodiments of the present invention.

Turning to FIG. 3a, a phase lock loop system 300 with a particular sample and hold circuit 340 in accordance with some embodiments of the present invention is shown. Phase lock loop circuit 300 includes a phase/frequency detector 310, an oscillation control source 320, a loop filter 330 consisting of two capacitors 332, 336 and a resistor 334, a sample and hold circuit 340, a voltage controlled oscillator 360, and a frequency divider 370. In general operation, a reference frequency 380 is compared with a feedback of an output frequency 390, and the comparison is used to drive voltage controlled oscillator 360 to form output frequency 390 consistent with reference frequency 380. Loop filter 330 is a low pass filter including a resistor 334 and two capacitors 332, 336.

Sample and hold circuit 340 includes a switch 342 electrically coupled to oscillation control source 320 and to a capacitor 344. In addition, sample and hold circuit 340 includes another switch 346 that is electrically coupled to switch 342 and to another capacitor 348. Switch 342 is operated based on a switch frequency A 392, and switch 346 is operated based on a switch frequency B 394. In some embodiments of the present invention, switch frequency A 392 and switch frequency B are the same frequency with one being delayed relative to the other. As such, switch frequency A 392 and switch frequency B 394 would be considered derivatives of a switch frequency in accordance with the definition used herein. Various design considerations related to switch frequency A 392 and switch frequency B 394 will become more apparent in relation to the discussion of FIG. 3b below. Various voltages are also marked in relation to phase lock loop circuit 300 including the filtered voltage provided by oscillation control source 320, $V_{VCO}$ 343; the voltage at capacitor 344, $V_{C1}$ 345; and the voltage at capacitor 348, $V_{C2}$ 347

Figure 3B:
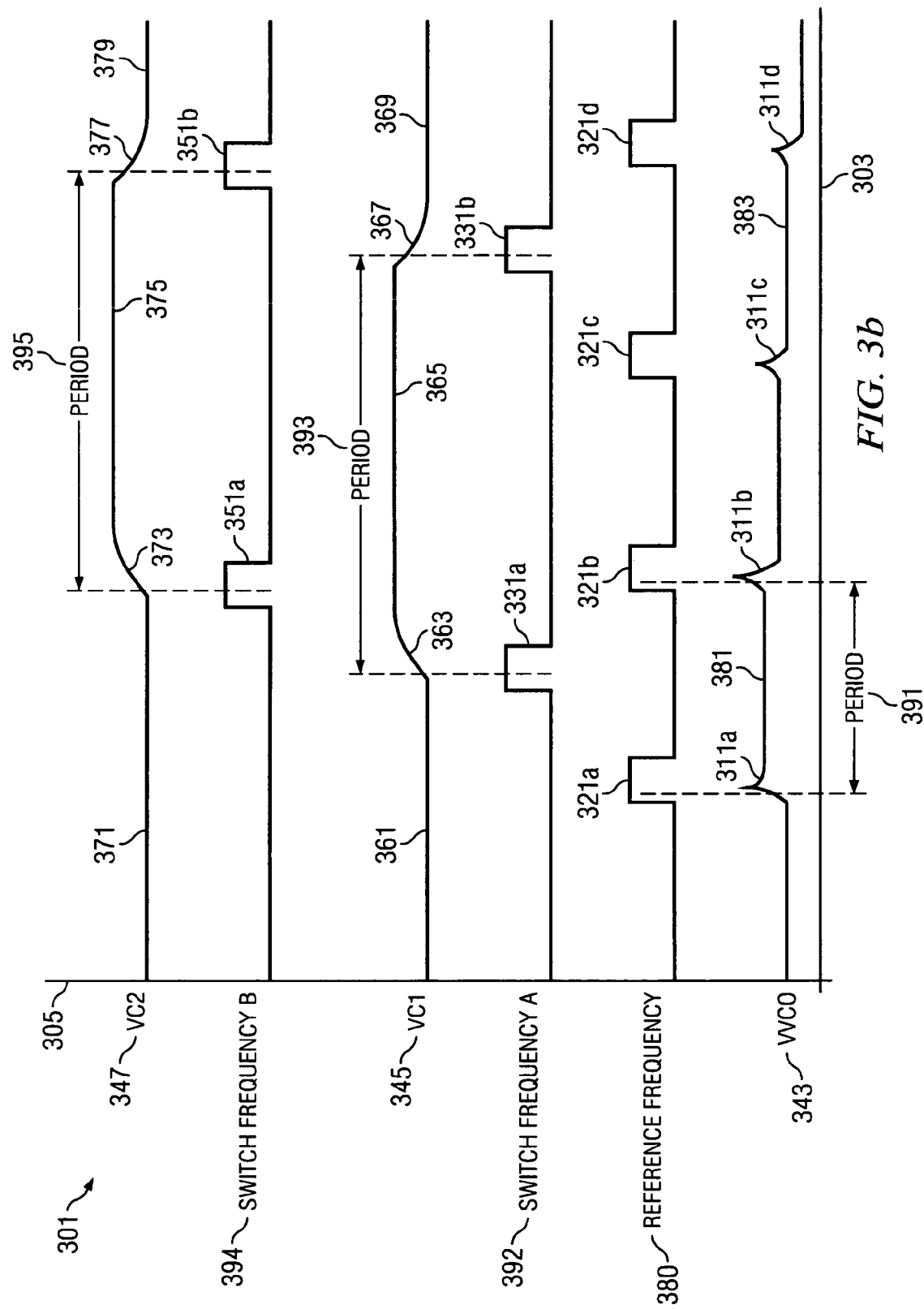

In some embodiments of the present invention, sample and hold circuit 340 introduces a zero at a desired switch frequency 392, 394 without the necessity of increasing the value of the passive elements. Operation of sample and hold circuit 340 is described in relationship to timing diagram 301 shown as FIG. 3b. Turning to FIG. 3b, timing diagram 301 shows a number of variables listed on a vertical axis 305 all interrelated as a function of time displayed on a horizontal axis 303. The variables include $V_{VCO}$ 343, reference frequency 380, switch frequency A 392, $V_{C1}$ 345, switch frequency 394, and $V_{C2}$ 347. Reference frequency 380 is shown as a number of clock pulses 321 with a period 391. Period 391 is also associated with a number of glitches 311 that occur on $V_{VCO}$ 343. It is desirable to avoid presenting glitches 311 to voltage controlled oscillator 360. To do this, $V_{VCO}$ 343 is sampled periodically under the control of switch frequency A 392. Switch frequency 392 is shown as a series of clock pulses 331, and may be any frequency value. However, in some cases, it is desirable to select reference frequency 380 as some multiple of switch frequency A 392. Where switch frequency A 392 is delayed from reference frequency 380, a sample of $V_{C1}$ 345 may be attained away from glitches 311. As shown, switch frequency A 392 (i.e., shown as a period 393) is one half of reference frequency 380 (i.e., shown as period 391). As with the discussion of phase lock loop circuit 200 above, based on the disclosure provided herein, one of ordinary skill in the art will recognize a variety of combinations of reference frequency 380 and switch frequency A 392.

Assertion of switch frequency A 392 (i.e., at the occurrence of pulses 331) causes switch 342 to close and capacitor 344 to charge. This is shown in relation to $V_{C1}$ 345. In particular, capacitor 344 is charged to a level 361 until pulse 331a occurs causing switch 342 to close. With switch 342 closed, capacitor 344 charges to a level 365. Level 365 is associated with a level 381 of $V_{VCO}$ 343. The charging period is shown as a transition 363 and is controlled by the time constant associated with capacitor 344. Similarly, assertion of switch frequency A 392 at pulse 331b causes capacitor 344 to discharge from level 365 to a level 369 across a transition 367 controlled by the aforementioned time constant associated with capacitor 344. The discharge to level 369 is associated with a level 383 of $V_{VCO}$ 343.

The value stored on capacitor 344 is then transferred to capacitor 348 as switch 342 opens and switch 346 closes. In particular, switch 342 opens as switch frequency A 392 de-asserts, and switch 344 closes as switch frequency B 394 asserts. Thus, where pulse 331a de-asserts and pulse 351a is asserted, charge stored on capacitor 344 is transferred to capacitor 348. This is shown as a transition from a level 371 to a level 375 across a transition 373. The time required to cross transition 373 is controlled by a time constant associated with capacitor 348. Similarly, as pulse 351b is asserted, capacitor 348 is discharged to a level 379 across a transition 377 based on the charge stored on capacitor 344. The value stored on capacitor 348, $V_{C2}$ 347, is applied to voltage controlled oscillator 360.

As previously discussed, in some embodiments of the present invention, the frequency of switch frequency A 392 and switch frequency B 394 are equivalent, thus period 393 is equivalent to a period 395. Further, based on the disclosure provided herein, one of ordinary skill in the art will recognize that it may be advantageous to design sample and hold circuit 340 such that a delay time from the rising edge of a pulse of switch frequency B 392 (e.g., pulse 331a) to the rising edge of switch frequency B 394 (e.g., pulse 351a) is greater than the time required to charge capacitor 344. Further, it may be desirable for the width of pulses 331 to exceed to time required to charge capacitor 344. Similarly, it may be desirable for the width of pulses 351 to exceed the time required to charge capacitor 348.

As with phase lock loop circuit 200, in contrast to a standard loop filter, the range of values for capacitors 332, 336 is increased due to the addition of sample and hold circuit 340. Thus, the design restraints discussed above in relation to other phase lock loop circuit architectures may be largely avoided.

In conclusion, the present invention provides novel systems, methods and arrangements for exchanging data. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for clock management, the system comprising:
   a controllable oscillator;
   an oscillation control source; and
   a sample and hold circuit disposed between the oscillation control source and the controllable oscillator, wherein the system forms at least a portion of a sigma-delta phase lock loop circuit.

2. The system of claim 1, wherein the sample and hold circuit includes a first
   capacitor electrically coupled to a first switch and a second switch, and a second capacitor electrically coupled to the second switch.

3. The system of claim 2, wherein the second capacitor is further electrically coupled to the controllable oscillator, and wherein the first switch is electrically coupled to the oscillation control source.

4. The system of claim 3, wherein the system further comprises:
   a divider circuit driven by the controllable oscillator.

5. The system of claim 3, wherein the system further comprises:
   a phase/frequency detector driving the oscillation control source.

6. The system of claim 3, wherein the system further comprises:
   a filter disposed between the oscillation control source and the controllable oscillator.

7. The system of claim 3, wherein a switch frequency is applied to the first switch and the second switch.

8. A system for clock management, the system comprising:
   a controllable oscillator;
   an oscillation control source; and
   a sample and hold circuit disposed between the oscillation control source and the controllable oscillator, wherein the sample and hold circuit is operable to introduce a transfer function having a sin x/x characteristic with a null at the switch frequency.

9. The system of claim 7, wherein the first switch switches at the switch frequency, and wherein when the first switch is closed the second switch is open.

10. A method for clock management, the method comprising:
    providing a phase lock loop circuit, wherein the phase lock loop circuit includes:
    a controllable oscillator;
    an oscillation control source; and a sample and hold circuit disposed between the controllable oscillator and the oscillation control source, wherein the sample and hold circuit introduces a transfer function in the phase lock loop circuit with a sin x/x characteristic with a null at the switch frequency; and applying a switch frequency to the sample and hold circuit, wherein a signal received from the oscillation control source is sampled and held for application to the controllable oscillator.

11. A method for clock management, the method comprising, providing a phase lock loop circuit, wherein the phase lock loop circuit includes:
a controllable oscillator;
an oscillation control source; and
a sample and hold circuit disposed between the controllable oscillator and the oscillation control source, wherein the sample and hold circuit comprising;
a first switch electrically coupled to the oscillation control source and to a first capacitor; and
a second switch electrically coupled to the first switch, the first capacitor. and the controllable oscillator; and applying a switch frequency to the sample and hold circuit, wherein a signal received from the oscillation control source is sampled and held for application to the controllable oscillator, wherein applying the switch frequency to the sample and hold circuit includes
applying a first derivative of the switch frequency to the first switch; and
applying a second derivative of the switch frequency to the second switch.

12. The method of claim 11, wherein the first derivative of the switch frequency is asserted such that the first switch is closed at a time when the second derivative of the switch frequency is asserted such that the second switch is open.

13. A phase lock loop circuit, the circuit comprising:
a phase/frequency detector;
an oscillation control source, wherein the oscillation control source is electrically coupled to the phase/frequency detector;
a sample and hold circuit operable to introduce a transfer function having a sin x/x characteristic with a null at the switch frequency, wherein the sample and hold circuit is electrically coupled to the oscillation control source;
a controllable oscillator, wherein the controllable oscillator is electrically coupled to the sample and hold circuit; and
a divider circuit, wherein the divider circuit is electrically coupled to the phase/frequency detector and to the controllable oscillator.

14. The phase lock loop circuit of claim 13, wherein the sample and hold circuit includes a first capacitor electrically coupled to a first switch and a second switch, and a second capacitor electrically coupled to the second switch; wherein the second capacitor is electrically coupled to the controllable oscillator; and wherein the first switch is electrically coupled to the oscillation control source.

15. The phase lock loop circuit of claim 14, wherein a switch frequency is applied to the first switch and the second switch.

16. The phase lock loop circuit of claim 15, wherein the first switch switches at the switch frequency, and wherein when the first switch is closed the second switch is open.

* * * * *